United States Patent
Glenn et al.

(10) Patent No.: US 6,661,080 B1
(45) Date of Patent: Dec. 9, 2003

(54) STRUCTURE FOR BACKSIDE SAW CAVITY PROTECTION

(75) Inventors: Thomas P. Glenn, Gilbert, AZ (US); Steven Webster, Muntinlupa (PH); Roy Dale Hollaway, Chandler, AZ (US)

(73) Assignee: Amkor Technology, Inc., Chandler, AZ (US)

(*) Notice: Subject to any disclaimer, the term of this patent is extended or adjusted under 35 U.S.C. 154(b) by 3 days.

(21) Appl. No.: 09/895,996

(22) Filed: Jun. 28, 2001

(51) Int. Cl.[7] ............................................. H01L 23/544
(52) U.S. Cl. ................ 257/620; 257/626; 257/669; 257/696; 257/673; 438/57; 438/60; 438/64; 438/106; 438/110; 438/113; 438/116; 438/401; 438/460; 438/461; 438/462; 438/463; 438/464; 438/465; 156/285; 156/286
(58) Field of Search ................. 438/57, 60, 64, 438/106, 116, 401, 110, 113, 460–465; 257/620, 626, 669, 696, 673; 156/285, 286

(56) References Cited

U.S. PATENT DOCUMENTS

| | | | |
|---|---|---|---|
| 5,037,779 A | 8/1991 | Whalley et al. | 437/211 |
| 5,096,851 A | 3/1992 | Yamazaki et al. | 437/205 |
| 5,148,266 A | 9/1992 | Khandros et al. | 357/80 |
| 5,173,766 A * | 12/1992 | Long et al. | 257/668 |
| 5,173,836 A | 12/1992 | Tomase et al. | 361/283 |
| 5,177,661 A | 1/1993 | Zavracky et al. | 361/283 |
| 5,296,730 A | 3/1994 | Takano | 257/417 |
| 5,362,681 A * | 11/1994 | Roberts et al. | 438/464 |
| 5,721,446 A | 2/1998 | Kobayashi | 257/419 |
| 5,852,320 A | 12/1998 | Ichihashi | 257/419 |
| 5,981,361 A * | 11/1999 | Yamada | 438/464 |
| 6,140,144 A | 10/2000 | Najafi et al. | 438/53 |
| 6,150,681 A | 11/2000 | Allen | 257/254 |
| 6,201,285 B1 | 3/2001 | Iwata et al. | 257/419 |
| 6,229,190 B1 | 5/2001 | Bryzek et al. | 257/419 |
| 6,254,815 B1 | 7/2001 | Cheperak | 264/135 |
| 6,255,728 B1 | 7/2001 | Nasiri et al. | 257/704 |
| 6,278,167 B1 | 8/2001 | Bever et al. | 257/415 |
| 6,323,058 B1 * | 11/2001 | Murakamz et al. | 257/712 |
| 6,326,682 B1 | 12/2001 | Kurtz | 257/678 |
| 6,338,985 B1 | 1/2002 | Greenwood | 438/126 |
| 6,346,742 B1 | 2/2002 | Bryzek et al. | 257/704 |

* cited by examiner

Primary Examiner—Kamand Cuneo
Assistant Examiner—Lisa Kilday
(74) Attorney, Agent, or Firm—Gunnison, McKay & Hodgson, L.L.P.; Philip J. McKay (57) ABSTRACT

A structure includes holes formed in a layer of tape. The holes are aligned over active areas on chips formed in a wafer. A custom vacuum chuck with a plurality of suction ports is aligned on the tape such that the suction ports contact only the tape and not the hole portions. Flats of the custom vacuum chuck are formed so that a perimeter of the flats contacts, and rests on, the tape. In addition, the flats of the custom vacuum chuck are formed so that the flats cover the entire active area on the first surface of each of the chips. Consequently, the combination of the custom vacuum chuck and the single layer of tape form a protective cavity over the active areas of the chips during singulation from the wafer.

6 Claims, 5 Drawing Sheets

STRUCTURE FOR BACKSIDE SAW CAVITY PROTECTION

BACKGROUND OF THE INVENTION

1. Field of the Invention

The present invention relates generally to wafer singulation. More particularly, the present invention relates to a structure used in wafer singulation.

2. Description of the Related Art

A number of electronic component chips (hereinafter "chips") are batch processed as an array on a wafer. The wafer is then cut to singulate the wafer and to separate the chips from the wafer and each other.

For certain applications, e.g., micro-machine chips, a first surface of the chips includes a first area, also called an active area. Illustratively, the active area typically is one of various types of special-purpose devices, such as, for example, micromachines. With these chips, it is critical that the active area not be contacted and contaminated with silicon shards, particulates, or water from the singulation process. Otherwise, the active area is damaged or destroyed. Consequently, the active area must be protected from undesired contamination or contact during the wafer singulation process.

One prior art technique to protect the active area of these chips is disclosed in Roberts Jr., et al., U.S. Pat. No. 5,362,681, which is herein incorporated by reference in its. The Roberts method uses two separate layers of tape for protecting the active area of a chip during wafer singulation.

According to Roberts, precisely positioned, spaced-apart holes are mechanically punched into the first layer of tape. The punched holes in the first layer are then precisely aligned over the active areas on the front-side surface of the wafer and the first layer of tape is attached to the front-side surface of the wafer. The second layer of tape is then attached to the first layer sealing the punched holes and forming cavities over the active areas. In this manner, the two layers of tape protect the active areas. The wafer is then singulated from the back-side surface of the wafer.

It should be readily apparent that mechanically punching the holes in the first layer, precisely aligning the holes over the active areas on the front-side surface of the wafer, attaching the first layer to the front-side surface of the wafer, and attaching the second layer to the first layer to seal the holes is relatively expensive and complex. In particular, the cost of two layers of tape, which are discarded after singulation, is prohibitive in an industry as cost conscience and competitive as the electronic component packaging industry.

In addition, the time involved in placing two layers of tape, as well as the specialized machines to place the tape, also contributes to the overall cost of packaging and is inefficient at best. Consequently, a need exists for a simple, economical technique for protecting active areas on the front-side surface of a wafer from contaminants during singulation of the wafer.

SUMMARY OF THE INVENTION

In accordance with the present invention, precisely positioned, spaced-apart holes are mechanically punched into a single layer of tape. The punched holes in the single layer of tape are then precisely aligned over the active areas on a first surface of the chips on a first surface of the wafer and the single layer of tape is attached to the first surface of the wafer. Consequently, the single layer of tape on the first surface of the wafer includes tape holes positioned over the active areas of the chips that are separated, and surrounded, by tape portions attached to the non-active areas of the first surface of the chips.

Next, according to the invention, a special vacuum device, such as a custom designed vacuum chuck, is provided. One embodiment of a custom designed vacuum chuck according to the invention is created with a plurality of suction ports specifically formed to align on the single layer of tape such that the suction ports contact only the tape portions of the single layer of tape and not the tape holes. The suction ports are separated from each other by flat regions, called flats, surrounding each suction port. According to the invention, the flats of the custom vacuum chuck are precisely formed so that a perimeter of the flats contacts, and rests on, the tape portions of the single layer of tape. In addition, the flats of the custom vacuum chuck are formed so that the flats are positioned over, and cover, the entire active area on the first surface of each of the chips. Consequently, the combination of the custom vacuum chuck and the single layer of tape form a cavity over the active areas of the chips.

In this manner, according to the invention, the active surfaces of the chips on the wafer are not contacted by, contaminated by, or damaged by the custom vacuum chuck. However, since the flats of the custom vacuum chuck are formed so that the bulk of the flats are positioned over the entire active areas of the chips, the active areas on the first surface of the chips are protected from silicon shards, particulates, water and any other damage or contamination during the singulation process.

According to the invention, the individual chips are then singulated using "back-side" singulation methods. Once singulated, the individual chips are removed from the single layer of tape using a pick and place machine or similar methods.

In particular, a structure according to the present invention includes a wafer, the wafer having a wafer first surface and a wafer second surface, opposite the wafer first surface. A plurality of chips are formed in the wafer first surface, each chip of the plurality of chips having a chip first surface and a chip second surface, opposite the chip first surface, an active area is formed on the chip first surface of each chip;

The structure also includes a single layer of tape, the single layer of tape including a tape first surface and a tape second surface, opposite the tape first surface. The single layer of tape further includes tape holes in the single layer of tape such that the single layer of tape consists of a plurality of tape holes extending from the tape first surface to the tape second surface, and a plurality of tape regions between the holes. The tape second surface is applied to the wafer first surface such that each of the tape holes is aligned over a corresponding one of the active areas on the chip first surfaces.

The structure of the invention further includes a vacuum device, the vacuum device having a vacuum channel, a plurality of suction ports and a plurality of flats between the suction ports. The vacuum device is positioned over the tape first surface such that the suction ports are aligned over only the tape portions surrounding the tape holes and not over the tape holes. In addition, the vacuum device is positioned such that each tape hole of the plurality of tape holes is covered by at least one of the flats of the vacuum device so that a cavity is formed over the active area of each of the chips.

Using the structure and structure of the invention, only a single layer of tape is required, i.e., attaching a second layer of tape to the first layer to seal the holes, as was done in the prior art, is eliminated. Accordingly, processing of micro-machine chips in accordance with the present invention is less complex, less labor intensive and thus less expensive than fabrication of micro-machine chips in the prior art.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

In accordance with the present invention, precisely positioned, spaced-apart holes (28 in FIGS. 1A, 1C, 1D, 2, 3, 4, and 5) are mechanically punched into a single layer of tape (10 in FIGS. 1A, 19, 1C, 1D, 2, 3, 4, and 5). The punched holes in the single layer of tape are precisely aligned over the active areas (101A, 101B and 101C in FIGS. 1C, 1D, 2, 3, 4, and 5) on a first surface (107A, 107B and 107C in FIGS. 1C, 1D, 2, 3, 4, and 5) of integrated circuit chips (40A, 40B, and 40C in FIGS. 1C, 1D, 2, 3, 4, and 5) on a first surface (105 in FIG. 1C) of a wafer (35 in FIGS. 1B, 1C, 1D, 2, 3, 4, and 5) and the single layer of tape is attached to the first surface of the wafer. Consequently, the single layer of tape on the first surface of the wafer includes holes positioned over the active areas of the chips that are separated, and surrounded, by tape portions (29 in FIGS. 1B, 1C, 1D, 2, 3, 4, and 5) attached to the non-active areas of the first surface of the chips.

Next, according to the invention, a special vacuum device, such as a custom designed vacuum chuck (150 in FIGS. 1D, 2, 3, 4, and 5), is provided. One embodiment of a custom designed vacuum chuck according to the invention is created with a plurality of suction ports (155 in FIGS. 1D, 2, 3, 4, and 5) specifically formed to align on the single layer of tape such that the suction ports contact only the tape portions of the single layer of tape and not the hole portions. The suction ports are separated from each other by flats (157A, 157B and 157C in FIGS. 1D, 2, 3, 4, and 5) surrounding each suction port. According to the invention, the flats of the custom vacuum chuck are precisely formed so that a perimeter (165 in FIG. 1D) of the each of the flats contacts, and rests on, the tape portions of the single layer of tape. In addition, each of the flats of the custom vacuum chuck are formed so that the bulk (167 in FIG. 1D) of the flat is positioned over, and covers, the entire active area on the first surface of each of the chips.

In this manner, according to the invention, the active areas of the chips on the wafer are not contacted by, contaminated by, or damaged by the custom vacuum chuck. However, since the flat regions of the custom vacuum chuck are formed so that the bulk of the flat regions are positioned over the entire active areas of the chips, the active areas on the first surface of the chips are protected from silicon shards, particulates, water and any other damage or contamination during the singulation process.

Figure 3:
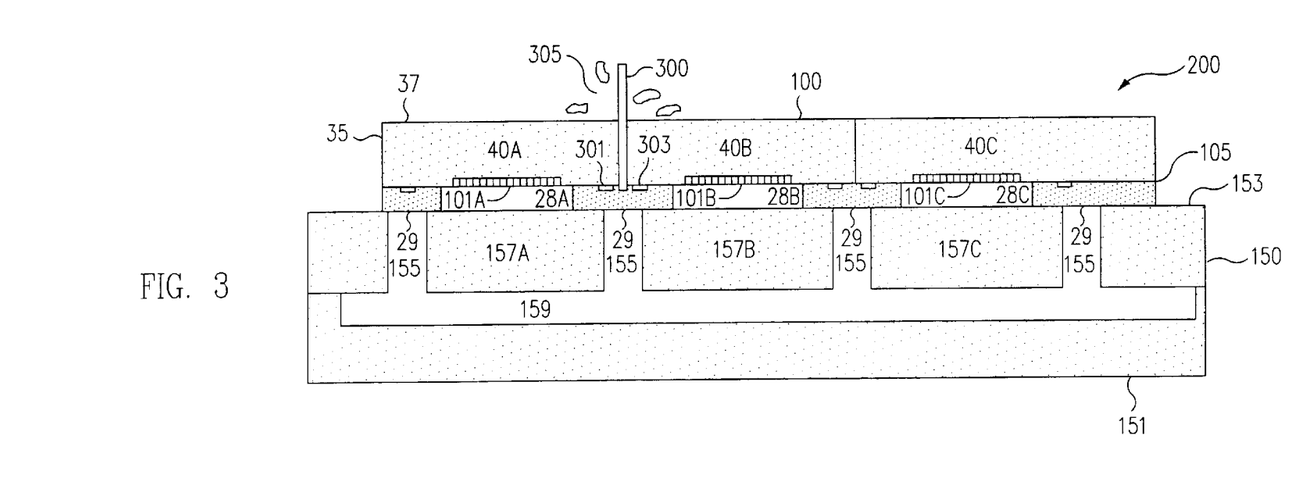
FIG. 3 is an enlarged cross-sectional view of the structure of FIG. 2 including a saw making a cut along a singulation street on a first surface of the wafer during singulation processing in accordance with one embodiment of the present invention.
Figure 4:
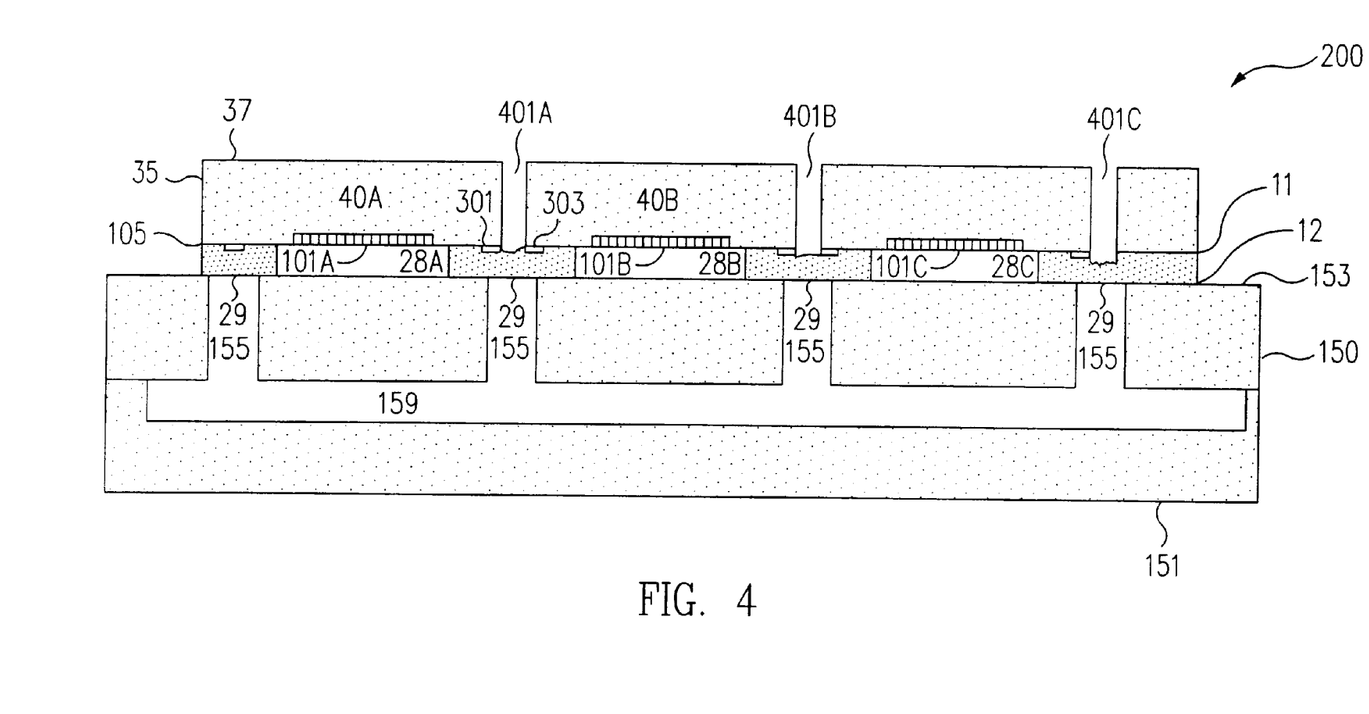
FIG. 4 is a cross-sectional view of the structure of FIG. 3 at a further stage during singulation processing in accordance with one embodiment of the present invention.
Figure 5:
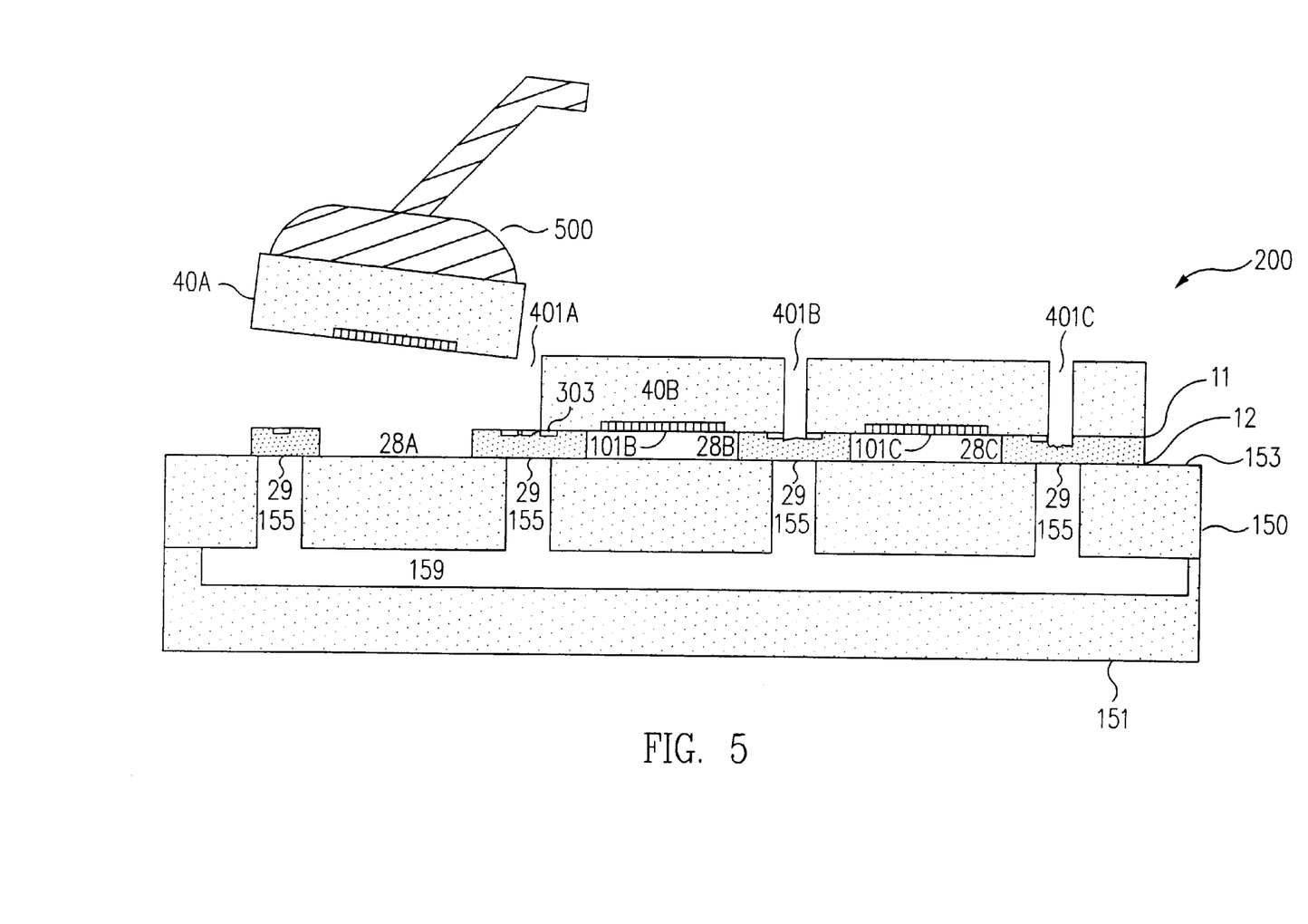
FIG. 5 is a cross-sectional view of the removal of a chip from the single layer of tape in accordance with one embodiment of the present invention.

According to the invention, the individual chips are then singulated using "back-side" singulation methods (FIGS. 3, 4 and 5). Once singulated, the individual chips are removed from the single layer of tape using a vacuum head (500 ion FIG. 5) of a pick and place machine or similar methods.

Using the method and structure of the invention, only a single layer of tape is required, i.e., attaching a second layer of tape to the first layer to seal the holes, as was done in the prior art, is eliminated. Accordingly, processing of micro-machine chips in accordance with the present invention is less complex, less labor intensive and thus less expensive than fabrication of micro-machine chips in the prior art.

Figure 1A:
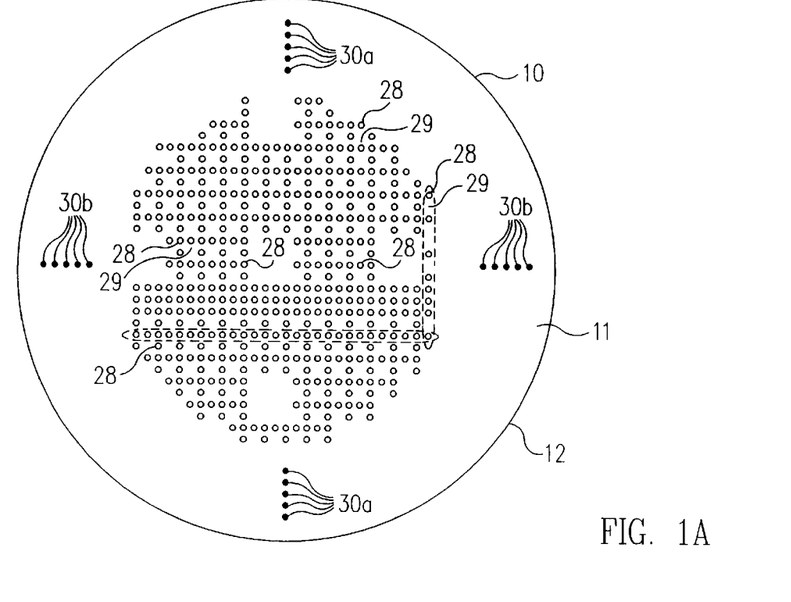
FIG. 1A shows an overhead view of a second surface of a portion of tape in accordance with one embodiment of the present invention.

FIG. 1A shows a second surface 11 of a portion of single layer of tape 10. Single layer of tape 10 can be any one of several types of tape well known in the art such as those made by Lintec including Lintec ADWILLD375, any of the tapes made by Nitto, or any other wafer tapes made by numerous other manufacturers well known in the art. As shown in FIG. 1A, according to the invention, a plurality of holes 28 are created in single layer of tape 10 and extend completely through single layer of tape 10 from first surface 12 to second surface 11 of single layer of tape 10. Holes 28 can be formed by any method known in the art including mechanical punching or laser burning.

As shown in FIG. 1A, holes 28 are separated, and surrounded, by non-punched tape regions 29. Also shown in FIG. 1A are vertical alignment marks 30a and horizontal alignment marks 30b. Alignment marks 30a and 30b are used to properly and precisely position a wafer (not shown in FIG. 1A) on single layer of tape 10.

Figure 1B:
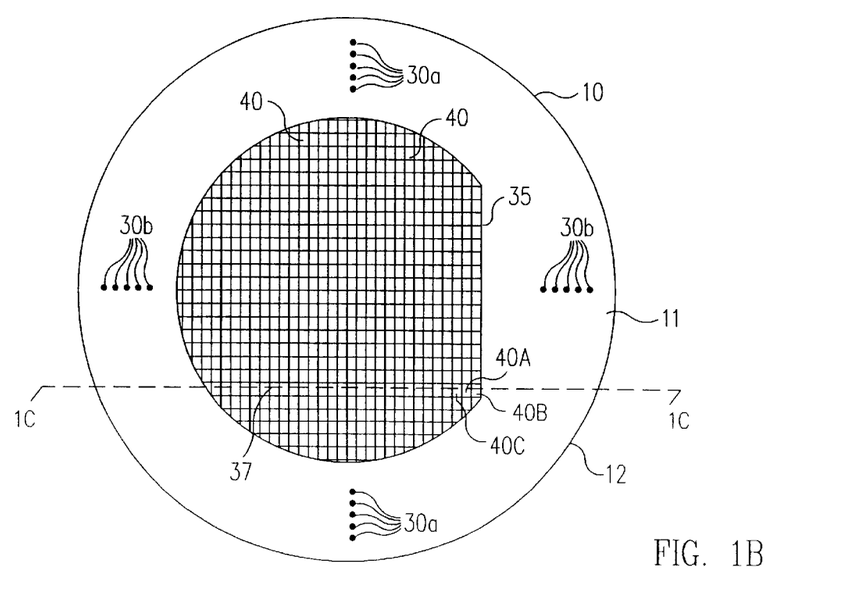
FIG. 1B shows an overhead view of a second surface of a wafer that is positioned on the portion of tape of FIG. 1A in accordance with one embodiment of the present invention.

FIG. 1B shows a second surface 37 of a wafer 35 including the second surfaces of a plurality of chips 40 that have been batch processed as an array on a first surface (not shown in FIG. 1B) of wafer 35. Also shown are exemplary chips. 40A, 40B and 40C. As discussed above, alignment marks 30a and 30b are used to apply second surface 11 of single layer of tape 10 to the first surface of wafer 35 such that holes 28 (FIG. 1A) are precisely aligned over active areas (not shown in FIG. 1B) on a first surface (not shown in FIG. 1B) of chips 40.

Figure 1C:
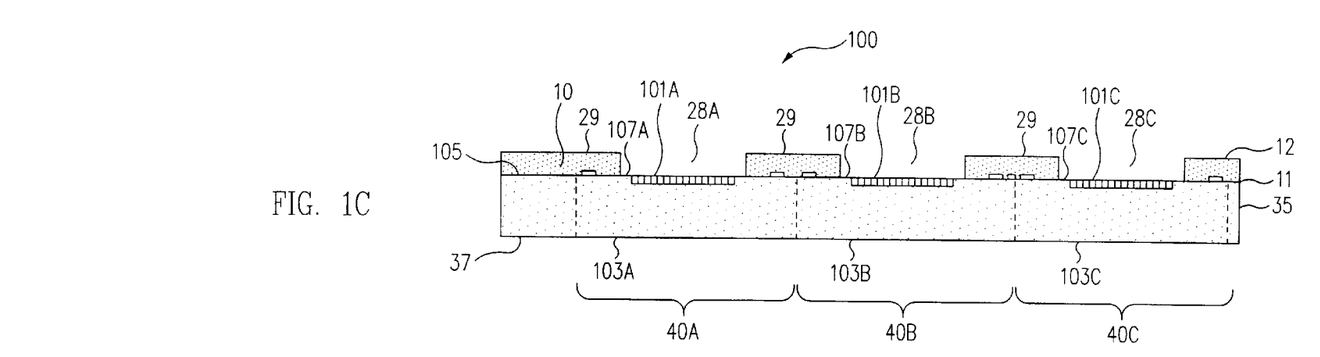
FIG. 1C is an enlarged cross-sectional view of a potion of the structure of FIG. 1B including a wafer that is positioned on the tape in accordance with one embodiment of the present invention.

FIG. 1C shows a structure 100 that is a portion of the structure of FIG. 1B, including chips 40A, 40B and 40C, as it would appear viewed along line 1C—1C in FIG. 1B. As seen in FIG. 1C, structure 100 includes: wafer 35; single layer of tape 10 and chips 40A, 40B and 40C. Wafer 35 includes wafer first surface 105 and wafer second surface 37. Single layer of tape 10 has tape first surface 12 and tape second surface 11. As discussed above, single layer of tape 10 also includes holes 28A, 28B and 28C and tape regions 29. Each chip 40A, 40B and 40C has an associated first surface 107A, 107B and 107C including an active area 101A, 101B and 101C, respectively.

As discussed above, and shown in FIG. 1C, second surface 11 of single layer of tape 10 is applied to first surface 105 of wafer 35 such that holes 28A, 289 and 28C are aligned over active areas 101A, 101B and 101C, respectively of chips 40A, 40B and 40C. Consequently, active areas 101A, 101B and 101C are exposed at the bottom of holes 28A, 28B and 28C, respectively.

Figure 1D:
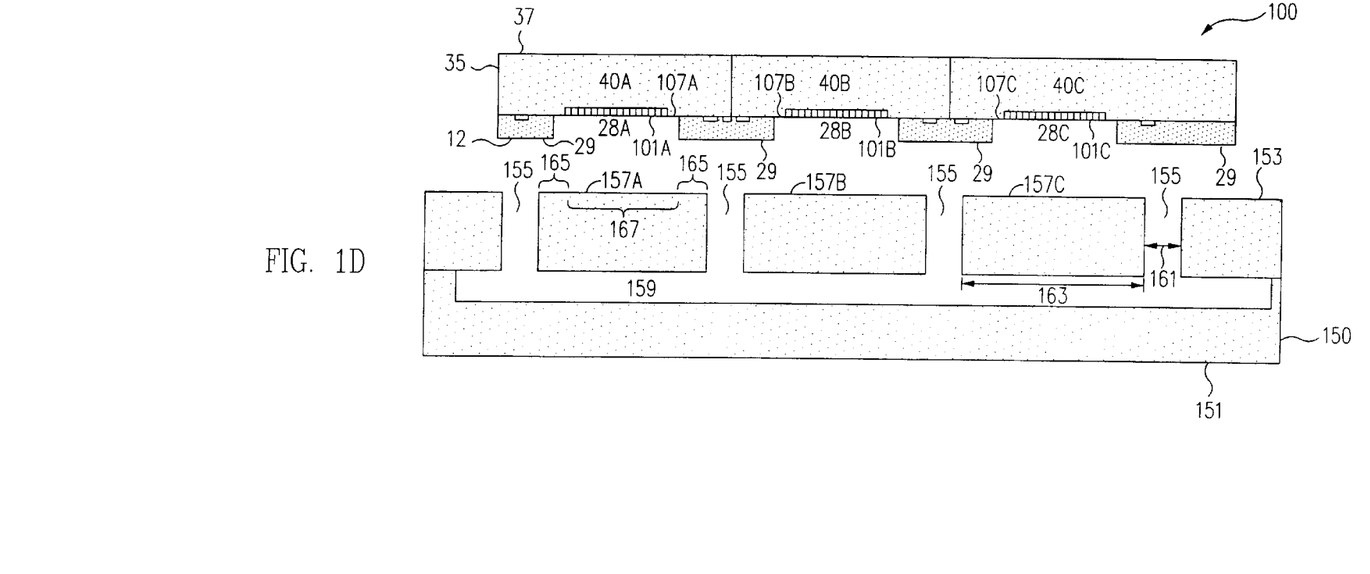
FIG. 1D shows an enlarged cross sectional view of the structure of FIG. 1C inverted and positioned over a custom vacuum chuck designed according to the invention.

FIG. 1D shows structure 100 of FIG. 1C inverted and positioned over a custom vacuum chuck 150 designed according to the invention. According to one embodiment of the invention, custom vacuum chuck 150 includes a chuck first surface 153, a chuck second surface 151, a plurality of suction ports 155, a plurality of flats 157A, 157B and 157C and a vacuum channel 159. According to the invention, custom vacuum chuck 150 is created with suction ports 155 specifically formed to align on first surface 12 of single layer of tape 10 such that suction ports 155 contact only tape regions 29 of first surface 12 of single layer of tape 10. In particular, suction ports 155 have a diameter 161 and are separated by flats 157A, 157B, and 157C with flat lengths 163 such that suction ports 155 do not contact holes 28A, 28B, and 28C. The suction ports are separated from each other by flats 157A, 157B, 157C surrounding each suction port.

Flats 157A, 157B and 157C of custom vacuum chuck 150 are precisely formed so that a perimeter of flats 157A, 157B and 157C contacts, and rests on, tape regions 29 of first surface 12 of single layer of tape 10. Using flat 157A as an example, according to the invention, only a perimeter 165 of flat 157A contacts, and rests on, tape regions 29 of first surface 12 of single layer of tape 10. In addition, flats 157A, 157B and 157C of custom vacuum chuck 150 are formed so that the bulk of flats 157A, 157B and 157C are positioned over, and cover, holes 28A, 28B and 28C and active areas 101A, 101B and 101C of chips 40A, 40B and 40C, respectively. Again using flat 157A as an example, the bulk 167 of flat region 157A is positioned over, and covers, hole 28A, including the entire active area 101A on first surface 107A of chip 40A.

Figure 2:
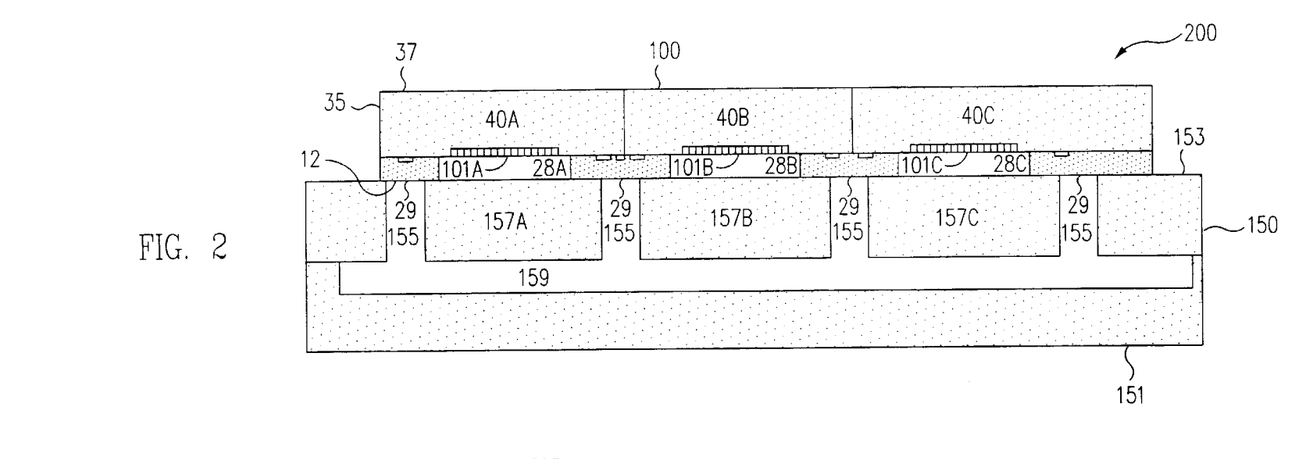
FIG. 2 shows an enlarged cross-sectional view of a structure that includes the structure of FIGS. 1C and 1D positioned on a first surface of the custom vacuum chuck in accordance with one embodiment of the present invention.

FIG. 2 shows a structure 200 that includes structure 100 of FIGS. 1C and 1D positioned on first surface 153 of custom vacuum chuck 150. As can be seen in FIG. 2, according to the invention, flats 157A, 157B and 157C of custom vacuum chuck 150 contact, and rest on, tape regions 29 of first surface 12 of single layer of tape 10. In addition, flats 157A, 157B and 157C of custom vacuum chuck 150 are positioned over, and cover, holes 28A, 28B and 28C and active areas 101A, 101B and 101C of chips 40A, 40B and 40C, respectively.

Structure 100 is held in place on first surface 153 of custom vacuum chuck 150 by a suction force created at suction ports 155 of custom vacuum chuck 150. This suction force is created by applying a vacuum, or very low pressure, to vacuum channel 159 using equipment (not shown) and methods well known to those of skill in the art.

According to the invention, active surfaces 101A, 101B and 101C of chips 40A, 40B and 40C, respectively, on wafer 35 are not contacted by, contaminated by, or damaged by the custom vacuum chuck 150. However, since, according to the invention, custom vacuum chuck 150 is formed so that flats 157A, 157B and 157C are positioned over, and cover, active areas 101A, 101B and 101C of the chips 40A, 40B and 40C, respectively, active areas 101A, 101B and 101C are protected from silicon shards, particulates, water and any other damage or contamination during the singulation process.

According to the invention, chips 40A, 40b and 40C are singulated from wafer 35 using "back-side" singulation methods. FIG. 3 shows a saw 300 making a cut along a singulation street between scribe lines 301 and 303 on first surface 105 of wafer 35, thereby singulating chip 40A from chip 40B and wafer 35. Saw 300 can be any one of the well know saws used in the art, such as a mechanical saw, laser saw or high-pressure water saw. Back-side singulation, cutting saws and methods and scribe lines are well known in the art. Consequently, these structures and methods will not be discussed in detail here to avoid detracting form the invention.

As shown in FIG. 3, during singulation saw 300 creates silicon shards and particulates 305 that are a potential source of contamination for active surfaces 101A, 101B and 101C of chips 40A, 40B and 40C, respectively. However, as discussed above, since, according to the invention, custom vacuum chuck 150 is formed so that flats 157A, 157B and 157C are positioned over, and cover, active areas 101A, 101B and 101C of the chips 40A, 40B and 40C, respectively, active areas 101A, 101B and 101C are protected from silicon shards and particulates 305, as well as water and any other damage or contamination during the singulation process. The process shown in FIG. 3 is repeated until each chip 40A, 40B and 40C of wafer 35 is sigulated from the other chips and wafer 35.

FIG. 4 shows structure 200 of FIGS. 2 and 3 after cutting with saw 300 as discussed above with respect to FIG. 3. As shown in FIG. 4, after cutting, structure 200 includes trenches 401A, 401B and 401C separating chips 40A, 40B and 40C. As also shown in FIG. 4, trenches 401A, 401B and 401C extend completely through wafer 35 from first surface 105 to second surface 37. However, saw 300 only scores single layer of tape 10 and trenches 401A, 401B and 401C do not extend through single layer of tape 10. As a result, chips 40A, 40B and 40C remain attached to each other via single layer of tape 10. Once trenches 401A, 401B and 401C are formed both horizontally and vertically for each chip 40A, 40B and 40C, chips 40A, 40B and 40C are removed from single layer of tape 10 by methods well know to those of skill in the art such as a pick and place machine.

FIG. 5 shows chip 40A being removed from single layer of tape 10 using a vacuum pickup head 500 of a pick and place machine (not shown). Once each of the chips 40A, 40B and 40C are removed, single layer of tape 10 is discarded and chips 40A, 40B and 40C are moved on to the next processing step.

According to the invention, the active surfaces of the chips on the wafer are not contacted, contaminated, or damaged, by the custom vacuum chuck. However, since the flat regions of the custom vacuum chuck are formed so that the bulk of the flat regions are positioned over the entire active areas of the chips, the active areas on the first surface of the chips are protected from silicon shards, particulates, water and any other damage or contamination during the singulation process. Consequently, using the method and structure of the invention, only a single layer of tape is required, i.e., attaching a second layer of tape to the first layer to seal the holes, as was done in the prior art, is eliminated.

Accordingly, processing of micro-machine chips in accordance with the present invention is less complex, less labor intensive and thus less expensive than fabrication of micro-machine chips in the prior art.

This application is related to Glenn et al., commonly assigned and co-filed U.S. patent application Ser. No. 09/895,995, entitled "METHOD OF BACKSIDE SAW CAVITY PROTECTION", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A structure comprising:
   a wafer, said wafer comprising a wafer first surface and a wafer second surface, opposite said wafer first surface;
   a plurality of chips formed in said wafer first surface, each chip of said plurality of chips comprising a chip first surface and a chip second surface, opposite said chip first surface, an active area being formed on said chip first surface of each chip;
   a single layer of tape, said single layer of tape comprising a tape first surface and a tape second surface, opposite said tape first surface, said single layer of tape further comprising tape holes in said single layer of tape such that said single layer of tape comprises a plurality of tape holes extending from said tape first surface to said tape second surface, and a plurality of tape regions between said holes, said tape second surface being applied to said wafer first surface such that each of said tape holes is aligned over a corresponding one of said active areas on said chip first surfaces;
   a vacuum device, said vacuum device comprising a vacuum channel, a plurality of suction ports and a plurality of flats between said suction ports, said vacuum device being positioned over said tape first surface such that said suction ports are aligned over only said tape portions surrounding said tape holes and not over said tape holes, said vacuum device being positioned further such that each tape hole of said plurality of tape holes is covered by at least one of said flats of said vacuum device, whereby at least one of said flats covers the entire active area on said first surface of each of said chips so that a cavity is formed over and protects the entire active area of each of said chips.

2. The structure of claim 1 wherein said tape is wafer tape.

3. The structure of claim 1 wherein said vacuum device is a custom chuck.

4. The structure of claim 1 wherein said chips are micro-machine chips and said active areas are micro-machine element areas.

5. A structure comprising:
   a wafer, said wafer comprising a wafer first surface and a wafer second surface, opposite said wafer first surface;
   a plurality of micro-machine chips formed in said wafer first surface, each micro-machine chip of said plurality of micro-machine chips comprising a micro-machine chip first surface and a micro-machine chip second surface, opposite said micro-machine chip first surface, a micro-machine active area being formed on said first surface of each micro-machine chip;
   a single layer of wafer tape, said single layer of wafer tape comprising a tape first surface and a tape second surface, opposite said tape first surface, said single layer of tape further comprising tape holes formed in said single layer of tape such that said single layer of tape comprises a plurality of tape holes extending from said tape first surface to said tape second surface, and a plurality of tape regions between said holes, said tape second surface being applied to said wafer first surface such that each of said tape holes is aligned over a corresponding one of said micro-machine active areas on said micro-machine chip first surfaces;
   a vacuum device, said vacuum device comprising a vacuum channel, a plurality of suction ports and a plurality of flats between said suction ports, said suction ports being spaced apart from each other, said vacuum device being positioned over said tape first surface such that said suction ports are aligned over only said tape portions surrounding said tape holes and not over said tape holes, said vacuum device being positioned further such that each tape hole of said plurality of tape holes is covered by at least one of said flats of said vacuum device, whereby at least one of said flats covers the entire active area on said first surface of each of said chips so that a cavity is formed over and protects the entire active area of each of said micro-machine chips.

6. A structure comprising:

a substrate means, said substrate means comprising a substrate means first surface and a substrate means second surface, opposite said substrate means first surface;

a plurality of electronic devices formed in said substrate means first surface, each electronic device of said plurality of electronic devices comprising an electronic device first surface and an electronic device second surface, opposite said electronic device first surface, a first area being formed on said electronic device first surface of each electronic device;

tape means, said tape means comprising a tape means first surface and a tape means second surface, opposite said tape means first surface, said tape means further comprising holes formed in said tape means such that said tape means comprises a plurality of holes extending from said tape means first surface to said tape means second surface, and a plurality of tape regions between said holes, said tape means second surface being applied to said substrate means first surface such that each of said holes is aligned over a corresponding one of said first areas on said electronic device first surfaces;

a chuck means, said chuck means comprising a vacuum channel, a plurality of suction means and a plurality of cover means between said suction means, said chuck means being positioned over said tape means first surface such that said suction means are aligned over only said tape portions surrounding said holes and not over said holes, said chuck means being positioned further such that each hole of said plurality of holes is covered by at least one of said cover means of said chuck means;

a low pressure means coupled to said chuck means vacuum channel such that said suction means contact only said tape portions surrounding said holes and not said holes, each hole of said plurality of holes thereby being covered by at least one of said cover means of said chuck means, whereby at least one of said cover means covers the entire first area on said first surface of each of said electronic devices such that a cavity is formed over and protects the entire first area of each of said electronic devices.

\* \* \* \* \*